United States Patent
Watanabe

(10) Patent No.: US 6,657,292 B2
(45) Date of Patent: *Dec. 2, 2003

(54) PACKAGE BOARD FOR MULTIPLE-PIN BALL GRID ARRAY PACKAGE, MULTIPLE-PIN BALL GRID ARRAY PACKAGE, AND SEMICONDUCTOR DEVICE

(75) Inventor: Masaki Watanabe, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/570,439

(22) Filed: May 12, 2000

(65) Prior Publication Data

US 2003/0011062 A1 Jan. 16, 2003

(30) Foreign Application Priority Data

Dec. 8, 1999 (JP) .......................................... 11-348917

(51) Int. Cl.⁷ .............................................. H01L 23/48
(52) U.S. Cl. ........................................ 257/697; 257/698
(58) Field of Search ................................ 257/697, 698, 257/700

(56) References Cited

U.S. PATENT DOCUMENTS

| | | | | |
|---|---|---|---|---|
| 4,221,047 A | * | 9/1980 | Narken et al. | ................. 29/840 |
| 5,714,801 A | * | 2/1998 | Yano et al. | ................. 257/691 |
| 6,057,600 A | * | 5/2000 | Kitazawa et al. | ............ 257/728 |
| 6,104,088 A | * | 8/2000 | Hatano et al. | ............... 257/698 |

FOREIGN PATENT DOCUMENTS

| | | | |
|---|---|---|---|
| EP | 0 475 269 A | * | 3/1992 |
| JP | 62-261191 | | 11/1987 |

* cited by examiner

*Primary Examiner*—Phat X. Cao
(74) *Attorney, Agent, or Firm*—McDermott, Will & Emery

(57) ABSTRACT

In a package board for a ball grid array package, bypassing wiring is provided for connecting external electrodes (pins) with each other. A ball grid array package is obtained by mounting an electric element on such a package board. Further, such ball grid array package is mounted on a common mounting board together with other electric element or elements. The other electric elements on the mounting board may be connected through the internal wiring in the package board. The wiring density of the mounting board for mounting a multiple-pin ball grid array package (BGA) or other electric elements can be reduced without increasing the number of layers in the entire body of the mounting board.

4 Claims, 4 Drawing Sheets

US 6,657,292 B2

PACKAGE BOARD FOR MULTIPLE-PIN BALL GRID ARRAY PACKAGE, MULTIPLE-PIN BALL GRID ARRAY PACKAGE, AND SEMICONDUCTOR DEVICE

BACKGROUND OF THE INVENTION

1. Field of the Invention

The present invention relates to semiconductor mounting technology, and more specifically to a structure of a package of a semiconductor device for mounting semiconductor elements.

2. Background Art

FIG. 5 is a pattern diagram illustrating the state where a multiple pin package is mounted on a mounting board in a semiconductor device according to the conventional art. FIG. 5 shows an arrangement of major portions of a multiple pin package mounted on a top surface of a mounting board and viewed from the bottom side of the mounting board.

In FIG. 5, reference numeral 1 shows a mounting board on which a plurality of ball-grid array packages are to be mounted, and the mounting board 1 extends beyond the periphery of the shown area in the drawing. Reference numeral 2 shows a multiple pin BGA package (hereafter simply referred to BGA) mounted on a determined portion of the mounting board 1; reference numeral 3 shows foot prints (pads) of the mounting board 1; reference numeral 4 shows a region of the mounting board 1 inside the broken line where wiring, to be connected to the multiple pin BGA 2, is densely disposed; reference numeral 5 shows some electronic elements mounted on the mounting board 1; and reference numeral 6 shows bypassing wiring in the mounting board 1 connecting the two electronic elements 5 with each other.

In a conventional multiple pin BGA 2, as shown in FIG. 5, the footprints 3 of the multiple pin BGA 2 are arranged in a lattice pattern, and signal lines are connected between chips and the mounting board 1. In such a conventional multiple pin BGA 2, a region 4 of high wiring density is formed because of a number of connections to the multiple pin BGA 2, and it is not easy to draw signal lines from the multiple pin BGA 2. Accordingly, the number of layers in the mounting board 1 need to be increased, or the lead lines of signals are forced to bypass in the vicinity of the region 4. An example of such a bypassed wiring is the bypassed wiring 6 for connecting the two electric elements 5 each other as shown in FIG. 5.

As described above, in mounting a conventional multiple pin BGA 2 on a mounting board 1, it is difficult to draw signal lines in the mounting board 1 from the multiple pin BGA 2. Therefore, the number of layers in a mounting board 1 is to be increased. The signal lines have to be bypassed in the vicinity of the region 4.

The object of the present invention is to solve the above problem, and to provide a package board for a multiple-pin ball grid array package, which reduces the wiring density in the mounting board at a mounting region of a multiple-pin BGA, without increasing the number of layers in the mounting board. The further objects of the present invention is to provide a multiple-pin ball grid array package formed on such a package board.

SUMMARY OF THE INVENTION

According to one aspect of the present invention, a package board for a multiple-pin ball grid array package comprises a base board. A plurality of first external terminals are arranged on one major surface of the base board. A plurality of first internal wiring is provided in the base board for connecting the first external terminals to an electronic element to be mounted on the other major surface of the base board. A plurality of second external terminals are arranged on the one major surface of the base board. Further, at least one second internal wiring is provided for directly connecting at least two of the second external terminals each other.

According to another aspect of the present invention, a multiple-pin ball grid array package comprises a package board and at least an electronic element mounted on the package board. Further, the package board includes a base board. A plurality of first external terminals are arranged on one major surface of the base board. A plurality of first internal wiring is provided in the base board for connecting the first external terminals to an electronic element mounted on the other major surface of the base board. A plurality of second external terminals are arranged on the one major surface of the base board. Further, at least one second internal wiring is provided for directly connecting at least two of the second external terminals each other.

According to another aspect of the present invention, a semiconductor device comprises a mounting board, a multiple-pin ball grid array package mounted on the mounting board, and a plurality of other electronic elements mounted on the mounting board. Further, the multiple-pin ball grid array package includes a package board and at least an electronic element mounted on the package board. Still further, the package board has at least one pair of external terminals and an internal wiring directly connecting the pair of external terminals each other. In addition, at least two of the electronic elements are electrically connected each other through the second external terminals and the second internal wiring of the package board of the multiple-pin ball grid array package.

According to another aspect of the present invention, a semiconductor device comprises a mounting board, a multiple-pin ball grid array package mounted on one major surface of the mounting board and a package board for a multiple-pin ball grid array package mounted on other major surface of the mounting board. The package board for a multiple-pin ball grid array package includes at least one pair of external terminals and an internal wiring directly connecting the pair of external terminals each other. Further, one of the pair of external terminals of the package board for a multiple-pin ball grid array package is electrically connected to the multiple-pin ball grid array package through the mounting board.

Other and further objects, features and advantages of the invention will appear more fully from the following description.

DETAILED DESCRIPTION OF THE PREFERRED EMBODIMENTS

Figure 1:
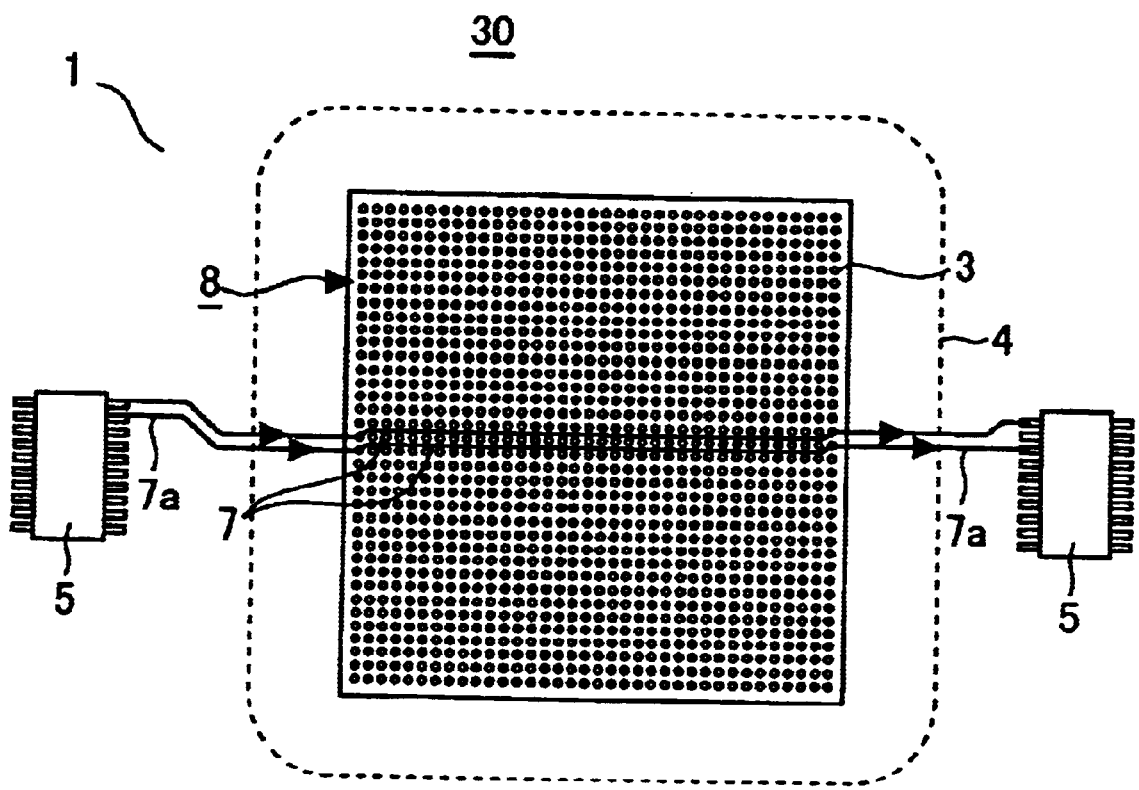
FIG. 1 is a plan view illustrating a mounting state of a multiple pin package on a mounting board in a semiconductor device according to a first embodiment of the present invention, and is viewed from the back side of the mounting board.

The preferred embodiments of the present invention will be described below referring to the drawings. In the drawings, the same symbols are used for representing the same or corresponding parts, and repetitive explanations will be simplified or omitted.

First Embodiment

A first embodiment of the present invention will be described in detail below referring to the drawings.

FIG. 1 illustrates a mounting state of a multiple pin package on a mounting board in a semiconductor device according to the first embodiment. FIG. 1 is an example of an optimal connection by signal lines inside a mounting board for mounting multiple-pin BGAs. FIG. 1 shows a layout of major portions of a multiple-pin package mounted on the top surface of a mounting board, and viewed from the back side of the mounting board.

In FIG. 1, reference numeral 30 denotes a semiconductor device of the first embodiment. Reference numeral 1 denotes a mounting board on which a multiple-pin BGA 8 is mounted. The mounting board 1 extends beyond the periphery of the shown area of the drawing. Reference numeral 8 shows a multiple-pin ball grid array package (hereafter abbreviated as BGA as required) mounted on a predetermined portion of the mounting board 1.

Reference numeral 3 denotes footprints (pads) of the mounting board 1. The reference numeral 3 may be deemed as external electrode balls of the multiple-pin BGA 8 mounted on the mounting board 1. Reference numeral 4 denotes a region of the mounting board 1 having a high wiring density for connection to the multiple-pin BGA 8, which is the region of the mounting board 1 inside the broken lines of FIG. 1.

Reference numeral 5 denotes some electronic elements mounted on the mounting board 1, and reference numeral 7 denotes wiring provided in the multiple-pin BGA 8 for connecting the two electronic elements 5 each other. Specifically, the wiring 7 are provided inside the mounting board 1 under the multiple-pin BGA 8, and respective ends of the wiring 7 is connected to the outermost external electrode 3 (pad) of the multiple-pin BGA 8. Reference numeral 7a denotes other wiring inside the mounting board 1 and is connected to the wiring 7 via the outermost external electrode 3 of the multiple-pin BGA 8. The two electronic elements 5 are electrically connected to each other through the wiring 7a and wiring 7.

Referring to FIG. 1, a semiconductor device 30 of the first embodiment is characterized in that optimal connection is achieved by providing bypassing signal lines in the multiple-pin BGA 8, in other words, the multiple-pin BGA 8 is constituted to have bypassing wiring 7 for adequately connecting the other electric elements 5 to each other.

Figure 2:
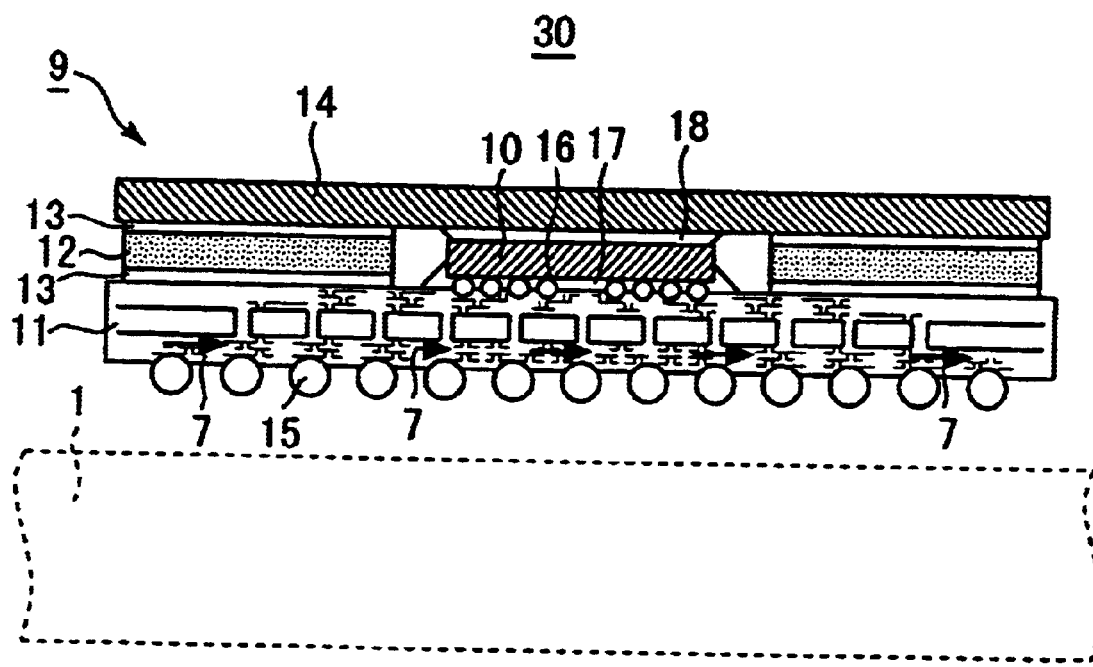
FIG. 2 is a partial cross sectional view showing a specific example of a semiconductor device of the first embodiment, and is viewed at a position of the multiple-pin BGA in FIG. 1.

FIG. 2 is a partial cross sectional view showing a specific example of a semiconductor device 30 of the first embodiment at a position of the multiple-pin BGA 8 in FIG. 1.

Although a BGA 8 in FIG. 1 can be of various types, FIG. 2 shows an example of a multiple-pin flip chip BGA (FC-BGA) using a buildup board as the package board, in which bypassing signal lines are provided.

In FIG. 2, reference numeral 9 denotes a multiple-pin FC-BGA adopting a buildup board as example of BGA 8 shown in FIG. 1.

Reference numeral 10 denotes a semiconductor chip, reference numeral 11 denotes a buildup board (as a package board for a multiple-pin BGA), reference numeral 12 denotes a stiffener, reference numeral 13 denotes adhesive, reference numeral 14 denotes a heat spreader for dissipating heat generated by the chip 10, reference numeral 15 denotes solder balls for electrically connecting the chip 10 with an external circuit, reference numeral 16 denotes bumps for electrically connecting the chip 10 with wiring on the buildup board 11, reference numeral 17 is an under-fill resin for fixing the chip 10 to the buildup board 11, and reference numeral 18 denotes a heat conducting resin for efficiently transmitting heat generated by the chip 10 to the heat spreader 14.

Reference numeral 7 denotes bypassing wiring provided in the multiple-pin FC-BGA 9, actually in the buildup board 11a, for connecting the two other electric elements 5 disposed on different positions of the mounting board 1 (see FIG. 1). Although wiring 7 are indicated by intermittent arrows in FIG. 2, this is for the convenience of illustration, and the wiring 7 is actually a continuous line. The opposite ends of the wiring 7 are connected to the outermost solder balls 15 respectively.

As shown in FIG. 2, in a buildup board 11 of the FC-multiple-pin BGA 9 in a semiconductor device 30 of the first embodiment, there is provided a signal line or lines, that is the wiring 7, that is not directly related to the mounted chip 10, and that connects the two other electric elements 5 provided on the mounting 1.

Accordingly, the freedom of wiring in the mounting board is effectively increased. Thus, two other electric elements 5 disposed on a mounting board 1 can be connected by a optimal route using the signal lines 7 in a multiple-pin FC-BGA 9.

In particular, when this embodiment is applied to a flip-chip type multiple-pin BGA 9 having a buildup board 11, a high wiring density is realized in the mounting board 1 at a position where the solder-balls 15 are disposed for electrically connecting the chip 10 with external circuits.

In the first embodiment, as described above, the multiple-pin BGA is characterized in that a path, which is not directly connected to the mounted chip and which is usually provided in the mounting board, is provided in the package board for a BGA.

According to the first embodiment, as described above, it is not required to increase the number of layers in the mounting board 1 for mounting the BGA. The first embodiment effectively enables the wiring density in the packaging region of the mounting board 1 to be lowered. Also, the first embodiment effectively increases the freedom of wiring, and decreases the number of wiring layers in the mounting board.

One aspect of the first embodiment as described above may be summarized as follows. A package board such as a buildup board 11 is provided for a multiple-pin ball grid array package. The package board 11 comprises a base board, a plurality of first external terminals 15 arranged on one major surface of the base board, and a plurality of first internal wiring for connecting the first external terminals 15 to an electronic element such as a chip 10 to be mounted on the other major surface of the base board. The package board 11 further comprises a plurality of second external terminals 15 arranged on the one major surface of the base board, and at least one second internal wiring 7 for directly connecting at least two of the second external terminals 15 each other.

Another aspect of the first embodiment as described above may be summarized as follows. A semiconductor device 30 comprises a mounting board 1, a multiple-pin ball grid array package 8 or 9 mounted on the mounting board 1, and a plurality of other electronic elements 5 mounted on the mounting board 1. The multiple-pin ball grid array package 8 or 9 includes a package board 11 and at least an electronic element 10 mounted on the package board 11, and the package board 11 has at least one pair of external terminals 15 and an internal wiring 7 directly connecting the pair of external terminals 15 each other. Further, at least two of the electronic elements 5 are electrically connected each other through the second external terminals 15 and the second internal wiring 7 of the package board 1 of the multiple-pin ball grid array package 8 or 9.

Second Embodiment

A second embodiment of the present invention will be described in detail below referring to the drawings.

Figure 3:
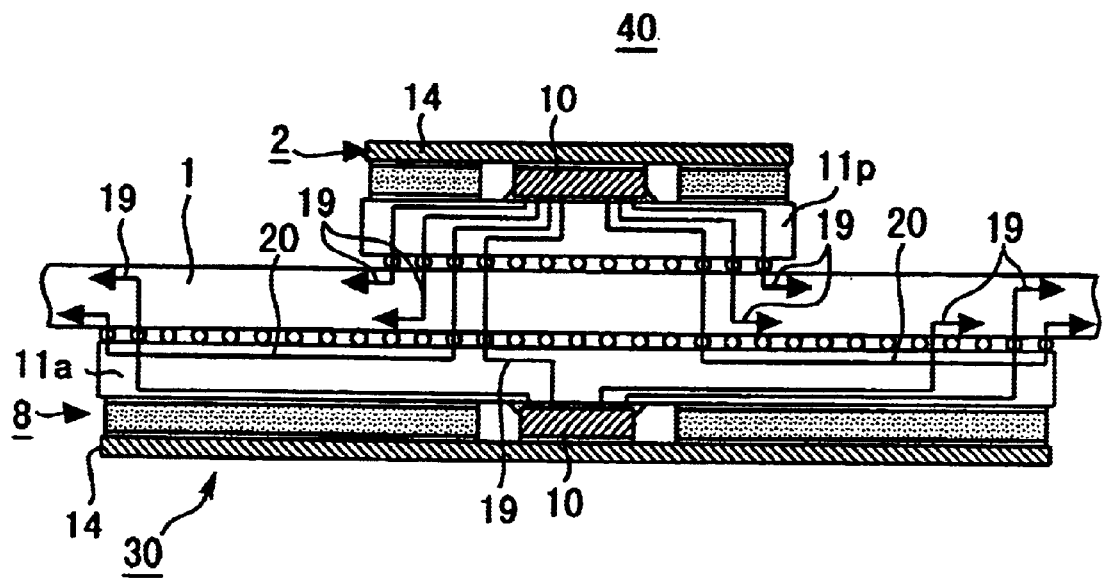
FIG. 3 is a sectional view illustrating a packaging state of a semiconductor device according to a second embodiment of the present invention, and includes a conventional multiple-pin BGA and a BGA of the present invention on a common mounting board.

FIG. 3 is a sectional view illustrating a packaging state of a semiconductor device according to the second embodiment of the present invention. FIG. 3 shows an example in which a BGA according to the first embodiment is mounted on one side of the mounting board and a conventional multiple-pin BGA is mounted on the opposite side of the mounting board.

In FIG. 3, reference numeral 40 denotes a semiconductor device according to the second embodiment, and includes a semiconductor device 30 according to the first embodiment and a conventional multiple-pin BGA 2.

Reference numeral 30 denotes a semiconductor device according to the first embodiment, and includes a mounting board 1 and a multiple-pin BGA 8. The multiple-pin BGA 8 includes a semiconductor chip 10, a package board 11a, conventional signal paths 19 in the package board 11a, bypassing signal paths or wiring 20 provided in the package board 11a, and a heat spreader 14.

Reference numeral 2 denotes a conventional multiple-pin BGA mounted on a major surface of the mounting board 1. This conventional multiple-pin BGA 2 includes another semiconductor chip 10 mounted on a package board lip, and is covered with a heat spreader 14.

The semiconductor device 40 according to the second embodiment is, as shown in FIG. 3, characterized in that a semiconductor device 30 of the first embodiment is mounted on one surface of a mounting board 1 and a conventional multiple-pin BGA 2 is mounted on the other surface of a mounting board 1. The signal lines 20 in the board 11a of the multiple-pin BGA 8 may be used for the sake of the conventional multiple-pin BGA 2. Some of the conventional signal lines 19 in the package board lip of the multiple-pin BGA 2 and in the mounting board 1 are drawn through the signal lines 20 in the board 11a of multiple-pin BGA 8 to the distant portion of the mounting board 1 where wiring density is low, and are connected again to the signal lines 19 in the mounting board 1.

As described above, in this embodiment, prepared is a package board 11a on which a plurality of grid-like terminals are provided, and in which wiring or signal lines 20 connecting between such terminals are provided. Such prepared board 11a is mounted on one surface of a mounting board 1 opposite to the surface where a conventional multiple-pin BGA 2 is mounted. The wiring or signal lines 20 in the prepared board 11a is connected to the conventional BGA through the wiring or signal lines 19 in the mounting board 1. This prepared board may be simply a package board or a package board in a BGA as described in the first embodiment.

This structure reduces the wiring density in the mounting board 1 at a mounting region of the multiple-pin BGA 2 without increasing the number of layers in the mounting board 1. In other words, the number of layers in the mounting board 1 is substantially increased at the area where the multiple-pin BGA 8 is mounted. As a result, in the second embodiment, high-density wiring connection to a multiple-pin BGA 2 can be achieved without increasing the number of layers in the mounting board 1. Thus, freedom of wiring in mounting board 1 is increased, and the number of layers in the mounting board 1 is decreased.

One aspect of the first embodiment as described above may be summarized as follows. A semiconductor device 40 comprises a mounting board 1, a multiple-pin ball grid array package 2 mounted on one major surface of the mounting board 1 and a package board 11a for a multiple-pin ball grid array package 8 mounted on other major surface of the mounting board 1. The package board 11a for a multiple-pin ball grid array package 8 includes at least one pair of external terminals and an internal wiring 20 directly connecting the pair of external terminals each other. Further, one of the pair of external terminals of the package board 11a for a multiple-pin ball grid array package 8 is electrically connected to the multiple-pin ball grid array package 2 through the mounting board 1.

Third Embodiment

A third embodiment of the present invention will be described in detail below referring to the drawings.

Figure 4:
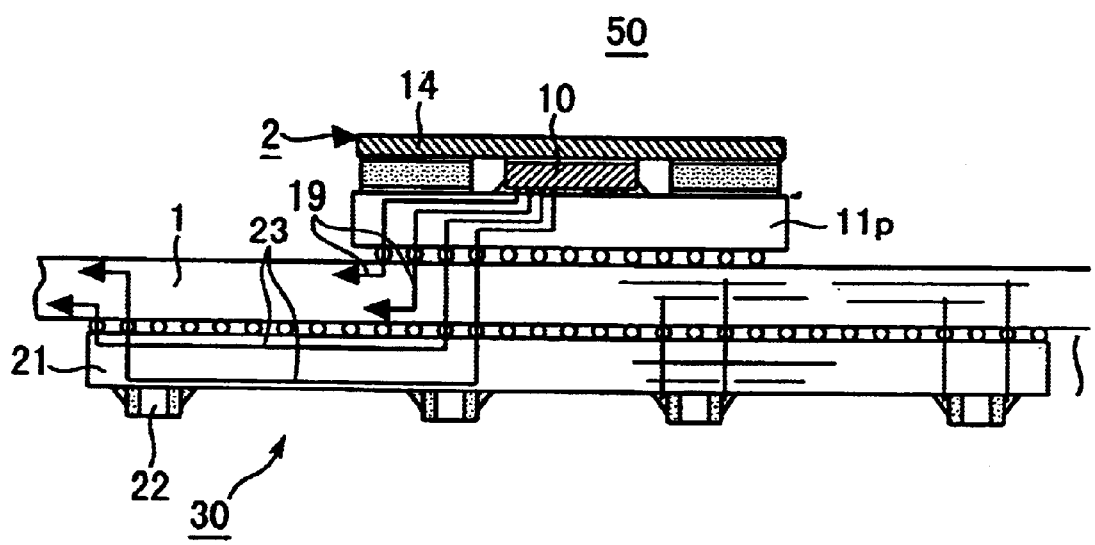
FIG. 4 is a sectional view illustrating a packaging state of a semiconductor device according to a third embodiment of the present invention, and includes a module board having chip condensers and a conventional multiple-pin BGA mounted oppositely on a common mounting board.
Figure 5:
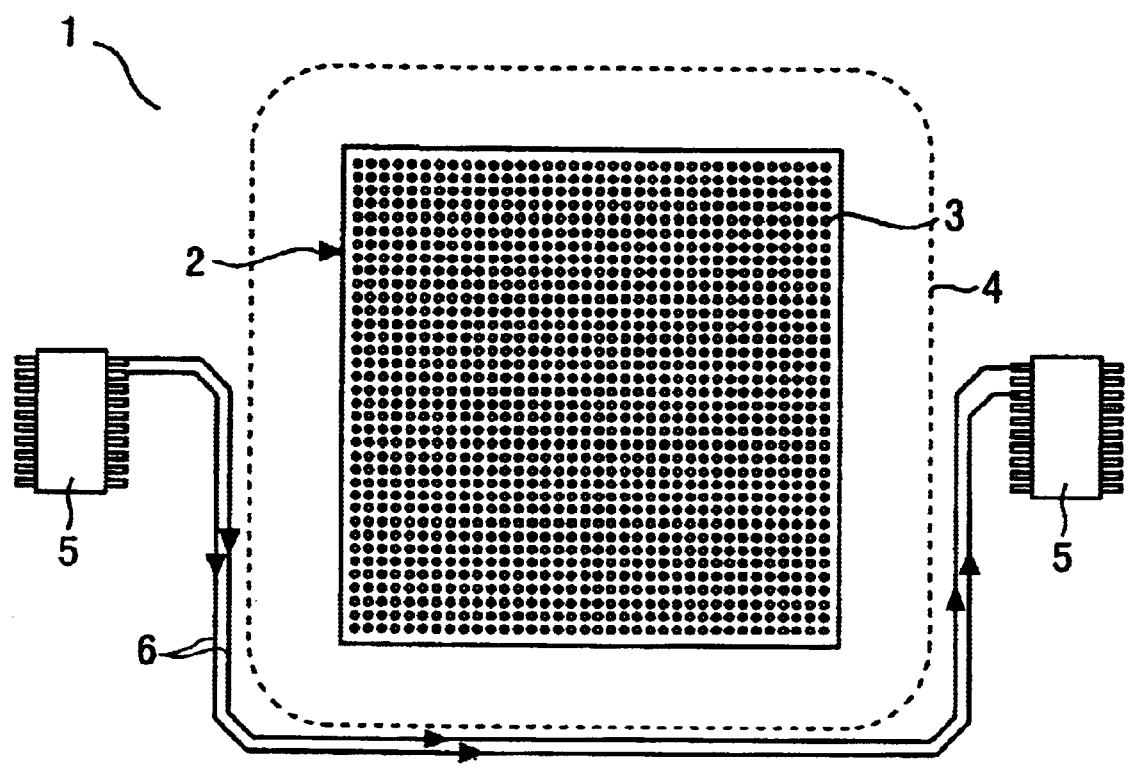
FIG. 5 is plan view of a pattern diagram illustrating the state where a multiple pin package is mounted on a mounting board in a semiconductor device according to the conventional art.

FIG. 4 is a sectional view illustrating a packaging state of a semiconductor device according to the third embodiment of the present invention. FIG. 4 shows an example of a semiconductor device in which a module board having chip condensers thereon are mounted on one surface of a mounting board where a conventional multiple-pin BGA is mounted on the opposite surface.

In FIG. 4, reference numeral 50 denotes a semiconductor device of this embodiment. Reference numeral 1 denotes a mounting board, and reference numeral 2 denotes a conventional multiple-pin BGA mounted on one surface of this mounting board 1.

Reference numeral 30 denotes a semiconductor device or an electronic element, and specifically an electronic element module, according to the first embodiment, mounted on another surface of the mounting board 1. In the semiconductor device 30, reference numeral 21 denotes a module board, reference numeral 22 denotes chip condensers mounted on the module board 21, and reference numeral 23 denotes bypassing signal lines or wiring provided in the module board 21.

The semiconductor device 50 according to the third embodiment is, as shown in FIG. 4, characterized in that a module board 21 having chip condensers 22 thereon is mounted on one surface of a mounting board 1 and a conventional multiple-pin BGA 2 is mounted on the other surface of a mounting board 1 at the opposite position. The bypassing signal lines 23 in the module board 21 of an electronic element module 30 may be used for the sake of the conventional multiple-pin BGA 2. Some of the conventional signal lines 19 in the package board 11p of the multiple-pin BGA 2 and in the mounting board 1 are drawn through the signal lines 23 in the module board 21 to the distant portion of the mounting board 1 where wiring density is low, and are connected again to other signal line 19 in the mounting board 1.

As described above, in this embodiment, prepared is a board 21 on which a plurality of grid-like terminals are provided, and in which bypassing wiring or signal lines 23 connecting between such terminals are provided. Such prepared board 21 is mounted on one surface of a mounting board 1 opposite to the surface where a conventional multiple-pin BGA is mounted. The wiring or signal lines in the prepared board is connected to the conventional BGA 2 through the wiring or signal lines 19 in the mounting board 1. This prepared board 21 may be simply a module board or a module board having chip condensers or other electronic elements thereon.

This structure reduces the wiring density in the mounting board 1 at a mounting region of the multiple-pin BGA 2 without increasing the number of layers in the mounting board 1. In other words, the number of layers in the mounting board 1 is substantially increased at the area where the multiple-pin BGA 8 is mounted. As a result, in the third embodiment, high-density wiring connection to a multiple-pin BGA 2 can be achieved without increasing the number of layers in the mounting board 1. Thus, freedom of wiring in the mounting board 1 is increased, and the number of layers in the mounting board 1 is decreased.

It is obvious that the present invention is not limited to the above-described embodiments, and the above-described embodiments can be modified as desired. The numbers, positions, shapes and the like of the constituting members in the above embodiments are not limited as described, but be properly modified.

One aspect of the third embodiment as described above may be summarized as follows. A semiconductor device 50 comprises a mounting board 1, a multiple-pin ball grid array package 2 mounted on one major surface of the mounting board 1 and a package board or a module board 21 mounted on other major surface of the mounting board 1. The package board or module board 21 includes at least one pair of external terminals and an internal wiring 23 directly connecting the pair of external terminals each other. Further, one of the pair of external terminals of the package board 21 is electrically connected to the multiple-pin ball grid array package 2 through the mounting board 1.

The features and advantages of the present invention as described above may be summarized as follows.

According to one aspect of the present invention, there is provided a package board, for a multiple-pin ball grid array package, which comprises internal wiring directly connecting a pair or a plurality of external terminals thereof. This will effectively reduce the wiring density of the packaging region of the mounting board, without increasing the number of layers in the mounting board.

According to another aspect, there is provided a multiple-pin ball grid array package comprising a package board and electronic elements mounted thereon, and the package board includes internal wiring directly connecting a pair of or a plurality of external terminals on the package board. This will effectively reduce the wiring density at the packaging region of the mounting board, without increasing the number of layers in the mounting board.

According to another aspect, there is provided a semiconductor device comprising a mounting board and a plurality of electronic elements as well as a multiple-pin ball grid array package mounted thereon. The package board for the multiple-pin ball grid array package comprises a plurality of external terminals and internal wiring directly connecting between these external terminals. The plurality of electronic elements are electrically connected through the internal wiring in the package board for the multiple-pin ball grid array package. This will effectively reduce the wiring density in the mounting board at the packaging region of the multiple-pin BGA, without increasing the number of layers in the mounting board.

According to another aspect, there is provided a semiconductor device including a mounting board on which a prepared board and a multiple-pin ball grid array package are mounted at opposite positions. The prepared board comprises internal wiring directly connecting a pair of or a plurality of external terminals thereof. The internal wiring of the prepared board may be connected through the mounting board to the multiple-pin ball grid array package. This will effectively reduce the wiring density in the mounting board at the packaging region of the multiple-pin BGA, without increasing the number of layers in the mounting board.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-348917, filed on Dec. 8, 1999 including specification, claims, drawings and summary, on which the Convention priority of the present application is based, are incorporated herein by reference in its entirety.

What is claimed is:

1. A package board for a multiple-pin grid array package, comprising:

a base board;

a plurality of first external terminals arranged on one major surface of said base board;

a plurality of first internal wiring for connecting the first external terminals to an electronic element to be mounted on the other major surface of said base board;

a plurality of second external terminals arranged on said one major surface of said base board; and at least one second internal wiring directly electrically connecting at least two of said second external terminals only to one another.

2. A package board according to claim 1, wherein said at least two of said second external terminals are positioned remotely from each other.

3. A multiple-pin grid array package comprising a package board and at least an electronic element mounted on said package board; said package board including:

a base board;

a plurality of first external terminals arranged on one major surface of said base board;

a plurality of first internal wiring for connecting said first external terminals to said electronic element mounted on the other major surface of said base board;

a plurality of second external terminals arranged on said one major surface of said base board; and at least one second internal wiring directly electrically connecting at least two of said second external terminals only to one another.

4. A multiple-pin ball grip array package according to claim 3, wherein said at least two of said second external terminals are positioned remotely from each other.

* * * * *

UNITED STATES PATENT AND TRADEMARK OFFICE
CERTIFICATE OF CORRECTION

PATENT NO. : 6,657,292 B2  Page 1 of 1
DATED : December 2, 2003
INVENTOR(S) : Masaki Watanabe It is certified that error appears in the above-identified patent and that said Letters Patent is hereby corrected as shown below:

<u>Title page,</u>
Item [73], Assignee, change "Mitsubishi Denki Kabushiki Kaisha" to
-- Renesas Technology Corp. --.

Signed and Sealed this

Second Day of March, 2004

JON W. DUDAS
*Acting Director of the United States Patent and Trademark Office*